United States Patent
Matsuura et al.

(10) Patent No.: US 12,057,417 B2
(45) Date of Patent: Aug. 6, 2024

(54) WAFER CHIP SCALE PACKAGE

(71) Applicant: Texas Instruments Incorporated, Dallas, TX (US)

(72) Inventors: Masamitsu Matsuura, Oita (JP); Daiki Komatsu, Oita (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 485 days.

(21) Appl. No.: 16/739,578

(22) Filed: Jan. 10, 2020

(65) Prior Publication Data

US 2021/0111136 A1 Apr. 15, 2021

Related U.S. Application Data

(60) Provisional application No. 62/915,572, filed on Oct. 15, 2019.

(51) Int. Cl.
*H01L 23/528* (2006.01)
*H01L 23/00* (2006.01)
*H01L 23/31* (2006.01)

(52) U.S. Cl.
CPC ......... *H01L 24/05* (2013.01); *H01L 23/3114* (2013.01); *H01L 23/528* (2013.01); *H01L 24/03* (2013.01); *H01L 24/11* (2013.01); *H01L 24/13* (2013.01); *H01L 2224/0231* (2013.01); *H01L 2224/0237* (2013.01); *H01L 2224/0362* (2013.01); *H01L 2224/03622* (2013.01); *H01L 2224/0391* (2013.01); *H01L 2224/0401* (2013.01); *H01L 2224/05567* (2013.01); *H01L 2224/05569* (2013.01); *H01L 2224/11013* (2013.01); *H01L 2224/11334* (2013.01)

(58) Field of Classification Search
CPC ................................. H01L 23/49816
See application file for complete search history.

(56) References Cited

U.S. PATENT DOCUMENTS

| | | | |
|---|---|---|---|
| 5,384,283 A | 1/1995 | Gegenwarth et al. | |
| 10,418,310 B2 | 9/2019 | Hoshino et al. | |
| 2009/0278263 A1 | 11/2009 | McCarthy et al. | |
| 2015/0123269 A1* | 5/2015 | Chen | H01L 24/11 257/737 |
| 2015/0333028 A1* | 11/2015 | Yap | H01L 24/11 257/738 |
| 2017/0162540 A1* | 6/2017 | Ji | H01L 24/13 |

FOREIGN PATENT DOCUMENTS

EP 0657923 6/1995

OTHER PUBLICATIONS

Wafer Level Package Development Team, Wafer Level Chip Scale Package, Analog Devices, Application Note AN-617, 2007-2012, pp. 1-12, AN-617, Analog Devices, Inc., USA.

* cited by examiner

*Primary Examiner* — William A Harriston
(74) *Attorney, Agent, or Firm* — Ronald O. Neerings; Frank D. Cimino

(57) ABSTRACT

A wafer chip-scale package (WCSP) includes a substrate including a semiconductor surface layer including circuitry configured for at least one function having at least a top metal interconnect layer thereon that includes at least one bond pad coupled to a node in the circuitry. A redistribution layer (RDL) including a bump pad is coupled by a trace to metal filled plugs through a passivation layer to the bond pad. A solder ball is on the bump pad, and a dielectric ring is on the bump pad that has an inner area that is in physical contact with the solder ball.

30 Claims, 6 Drawing Sheets

WAFER CHIP SCALE PACKAGE

CROSS REFERENCE TO RELATED APPLICATIONS

This application claims the benefit of Provisional Application Ser. No. 62/915,572 entitled "Wafer Scale Electronic Device," filed on Oct. 15, 2019, which is herein incorporated by reference in its entirety.

FIELD

This Disclosure relates to wafer chip scale packages having at least one redistribution layer.

BACKGROUND

A wafer chip scale package (WCSP), or CSP, is a type of integrated circuit (IC) package, which is a variant of the flip-chip interconnection technique where all packaging is implemented at the wafer level. The needed metal interconnect and the dielectric layers over the metal interconnect layers are applied on top of a wafer using photolithographic techniques that fit well with conventional wafer processing. These layers are typically thin, and a semiconductor die generally forms major portion of the package body. All the interconnects between the semiconductor die, the package, and the user's printed circuit board (PCB) are on the active side (top side) of the semiconductor die.

A redistribution layer (RDL) is formed from a process that generally involves one or two layers of metal and two or three layers of a polymer dielectric material, such as polyimide or benzocyclobutene (BCB). WLCSPs can be categorized into two different construction types, being a direct bump type and an RDL type. RDL technology allows a semiconductor die designed for wire bonding with bond pads connected to nodes in the circuitry all arranged along the periphery of the die, to be converted into a WCSP that has solder bump pads attributed throughout the area of the die.

In the case of the RDL type WCSP, multiple photolithography steps are used to form the solder bump pads for receiving the solder balls. These photolithography steps generally include forming at least one patterned RDL that includes bump pads that are lateral to the bond pads coupled together by RDL traces, a patterned re-passivation layer such as a polyimide (PI) layer on the RDL that exposes the bump pads, and then a patterned under bump metallization (UBM) layer is formed on the bump pads. A conventional WCSP thus requires three separate photolithography steps to form the solder bump pads.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize conventional RDL type WCSPs can benefit from tighter process control of the solder bump pads that may provide a yield enhancement. As described above in the Background, conventional RDL type WCSPs generally require three separate photolithography process steps for forming the solder bump pads. This conventional multiple photolithography step process flow results in assembly yield loss including losses due to electrical shorts resulting from seed layer residue.

Disclosed aspects include a dielectric ring, such as comprising solder resist, a polyimide, or an epoxy. Disclosed dielectric rings can be formed directly on the RDL bump pads without photolithography by additively depositing (e.g. inkjet printing, or screen printing) a ring of dielectric material on the bump pads in the step before the solder ball attach (or drop). The resulting dielectric ringed bump pads are referred to herein as a 'dielectric ringed solder bump pads.' Printing a disclosed dielectric ring on the bump pads to form disclosed dielectric ringed solder bump pads eliminates two of the three conventionally needed photolithography steps for forming RDL type WCSPs, eliminating the photolithography step for UBM formation on the bump pad, and the photolithography step for forming the patterned re-passivation layer on the RDL including on the periphery of the bump pad.

Accordingly, disclosed dielectric ringed solder bump pads can be formed from only one photolithography step, that being for the electroplating process to form the patterned RDL. As used herein, a 'ring' means an enclosed shape or the outline of an enclosed shape, such as substantially circular including elliptical, rectangular, or square. Disclosed rings can be fully continuous lines or curves, and can also be configured as a dashed-line comprising a plurality of spaced apart segments. Disclosed methods for forming disclosed dielectric ringed solder bump pads for RDL type WCSPs thus simplifies the conventional process flow for forming solder bump pads for RDL type WCSPs to provide a reduced cost solution by substituting a dielectric ring that can be additively deposited for two conventionally required photolithography process steps for forming solder bumps.

BRIEF DESCRIPTION OF THE DRAWINGS

Reference will now be made to the accompanying drawings, which are not necessarily drawn to scale, wherein:

FIG. 2A shows results after a photolithography step for RDL plating to provide a patterned RDL layer, including a plurality of bump pads and RDL traces. FIG. 2B shows results after printing dielectric rings on the bump pads, where the opening provided by the dielectric ring is sized for receiving a solder ball. FIG. 2C shows results after attaching solder balls onto the bump pads so that the solder balls physically contact the dielectric rings. FIG. 2D shows results after wafer molding to form a re-passivation layer generally using film assist molding.

DETAILED DESCRIPTION

Figure 1A:
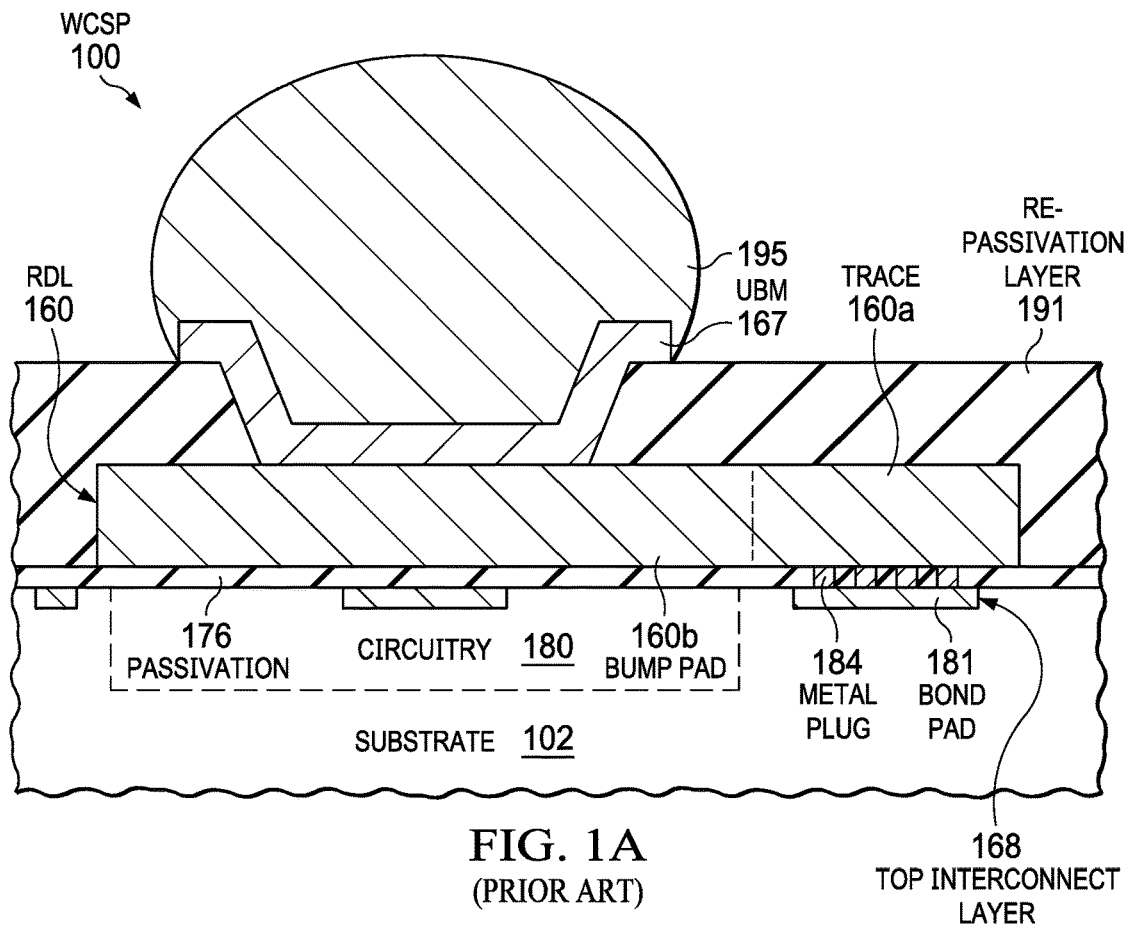
FIG. 1A is a cross-sectional view of a solder ball on a bump pad formed from an RDL, including a UBM layer on the bump pad, for a conventional RDL WCSP.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

FIG. 1A is a cross-sectional view of a conventional solder bump pad 160*b* with a solder ball 195 shown on the bump pad 160*b* formed from an RDL 160 having a UBM layer 167 on the bump pad 160*b* for a conventional RDL WCSP 100. A re-passivation layer 191 on the RDL 160 includes an aperture for the solder bump pad 160*b*. As described above in the Background, the re-passivation layer 191 generally comprises a polymer dielectric material, such as polyimide or BCB.

RDL WCSP 100 includes a substrate 102 comprising a semiconductor surface layer including circuitry 180 configured for at least one function having at least a top metal interconnect layer 168 thereon that includes at least one bond pad 181 coupled to a node in the circuitry 180. There is a passivation layer 176 having a passivation aperture for exposing the bond pad 181 on the top metal interconnect layer 168. The RDL 160 that generally comprises copper or a copper alloy and as shown includes a bump pad 160*b* coupled by a trace 160*a* that is shown coupled to metal filled plugs 184 (e.g., W plugs) through a passivation layer 176 to the bond pad 181. The passivation layer 176 although shown as a single layer, can also comprise two or more layers.

The solder ball 195 (e.g., about 200 µm in diameter) is on the UBM layer 167. The circuitry 180 comprises circuit elements (including transistors, and generally diodes, resistors, capacitors, etc.) that can be directly formed in the substrate 102 or can be formed in the epitaxial layer of a bulk substrate such as comprising silicon, where the circuitry 180 is configured together for generally realizing at least one circuit function. Example circuit functions include analog (e.g., amplifier or power converter), radio frequency (RF), digital, or non-volatile memory functions.

Figure 1B:
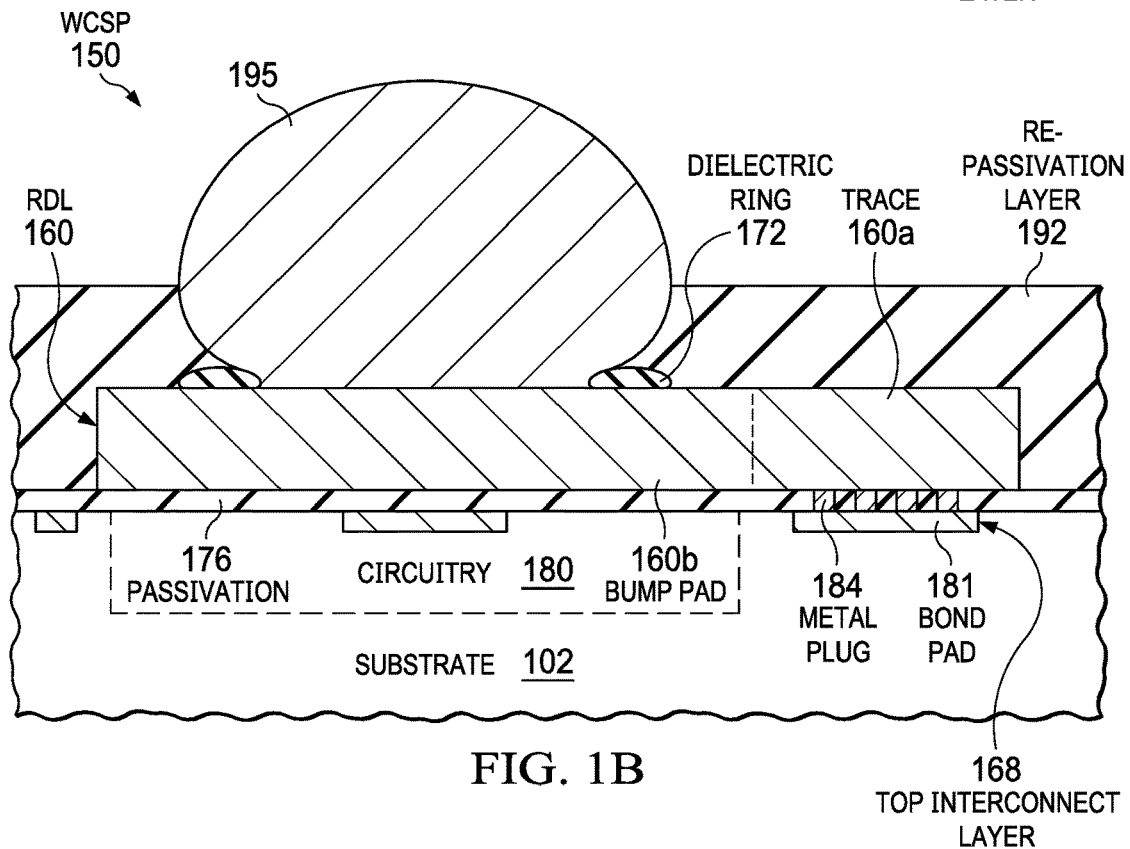
FIG. 1B is a cross-sectional view of a disclosed dielectric ringed solder bump pad with a solder ball on a bump pad of a disclosed RDL WCSP having disclosed dielectric ringed solder bump pads.

FIG. 1B is a cross-sectional view of a disclosed dielectric ringed solder bump pad with a solder ball 195 on a bump pad 160*b* of a disclosed RDL WCSP 150 having disclosed dielectric ringed solder bump pads. A re-passivation layer now shown as 192 that generally comprise a mold compound is on the RDL 160 that includes an aperture for the dielectric ringed solder bump pad. The dielectric ring is shown as 172. The dielectric ring 172 as described above can comprise a variety of different dielectric materials including solder resist, polyimide, or epoxy. Solder resist is also sometimes called solder mask, or solder stop mask, is known to be a thin lacquer-like layer of polymer that is commonly applied to the copper traces of a printed circuit board (PCB) for protection against oxidation, and to prevent solder bridges from forming between closely spaced solder pads. The dielectric ring 172 is generally 2 µm to 25 µm in the thickness direction, and has a width that is generally also 2 µm to 25 µm.

RDL WCSP 150 includes a substrate 102 comprising a semiconductor surface layer including circuitry 180 configured for at least one function having at least a top metal interconnect layer 168 thereon that includes at least one bond pad 181 coupled to a node in the circuitry 180. As with RDL WCSP 100 RDL, for WCSP 150 the RDL 160 includes a bump pad 160*b* coupled by a trace 160*a* shown coupled to metal filled plugs 184, such as W plugs, that provide coupling through the passivation layer 176 to the bond pad 181.

A solder ball 195 is directly on the bump pad 160*b*, so it can be seen there is no conventional UBM layer on the bump pad 160*b*. The dielectric ring 172 is on the bump pad 160*b* which has an inner area (e.g., inner diameter) in physical contact with the solder ball 195.

The re-passivation layer 192 generally comprises a dielectric layer such as a mold material that is epoxy-based which is positioned over the dielectric ring 172 and as noted above is in physical contact with the solder ball 195. A typical re-passivation layer 192 thickness is 75 µm to 150 µm, such as 100 µm to 125 µm thick.

Figure 2A:
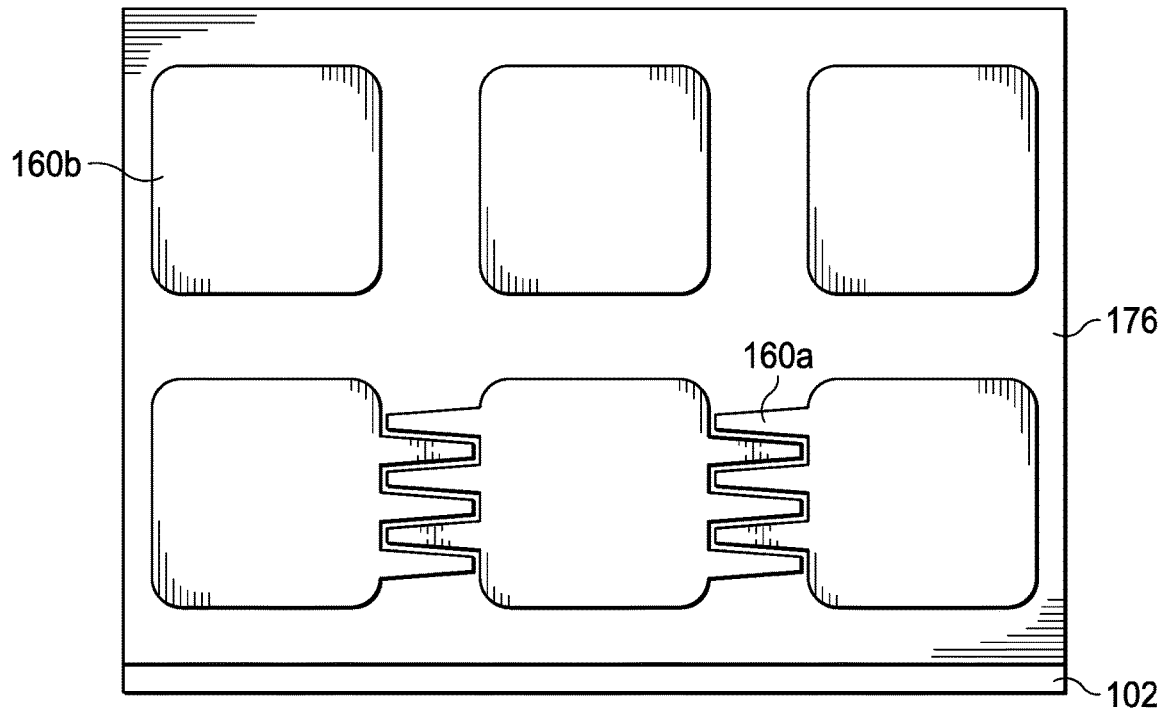
FIGS. 2A-2D depict successive top and cross-sectional views of an in-process RDL WCSP corresponding to steps in a disclosed process flow forming an RDL WCSP having disclosed dielectric ringed solder bump pads, according to an example aspect.
Figure 2A:
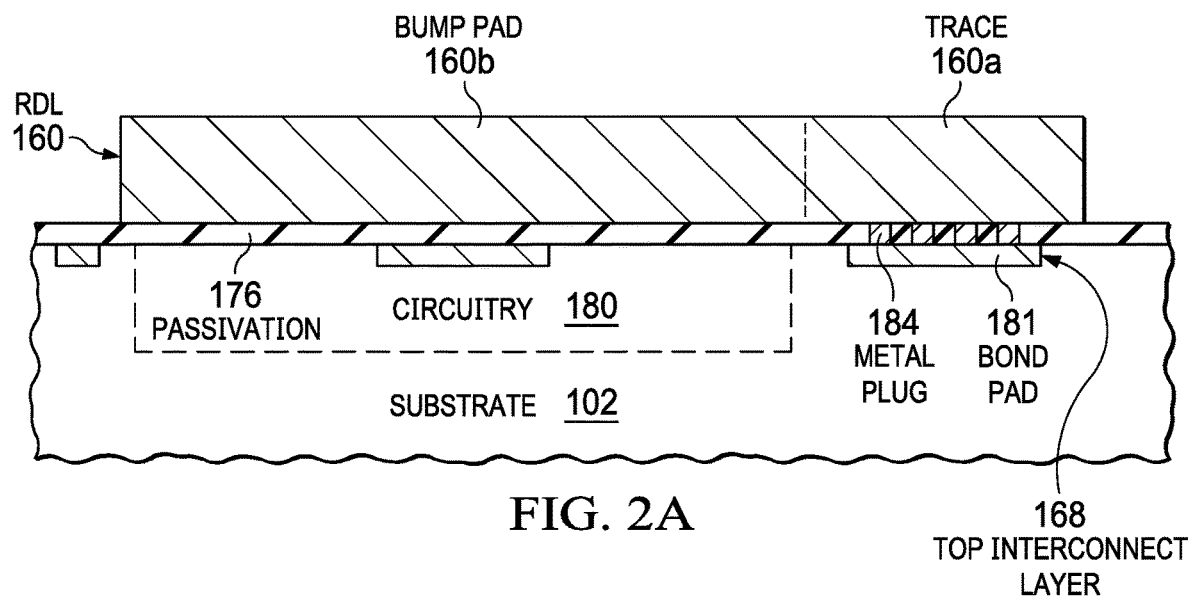

FIGS. 2A-2D depict successive top and cross-sectional views of an in-process RDL WCSP corresponding to steps in a disclosed process flow for forming an RDL WCSP having disclosed dielectric ringed solder bump pads. FIG. 2A shows results after a photolithography step for RDL plating to provide a patterned RDL layer, including a plurality of bump pads 160*b* and RDL traces 160*a*. The forming of the masking pattern can comprise laser abrasion.

Figure 2B:
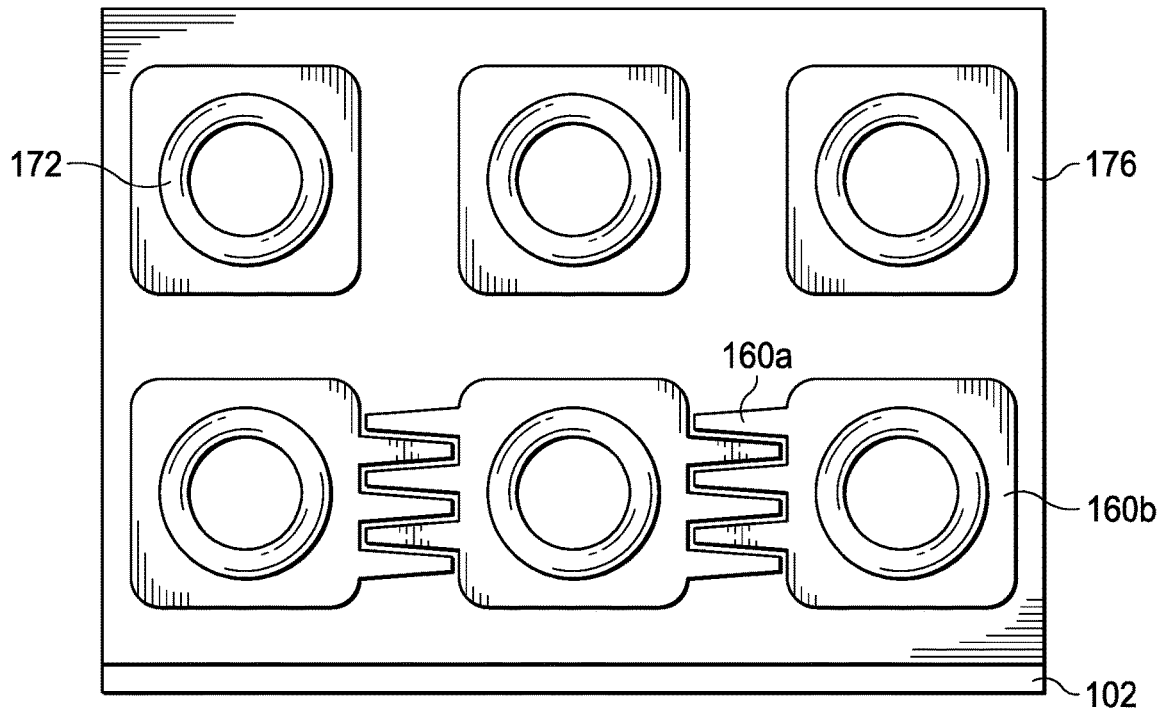
Figure 2B:
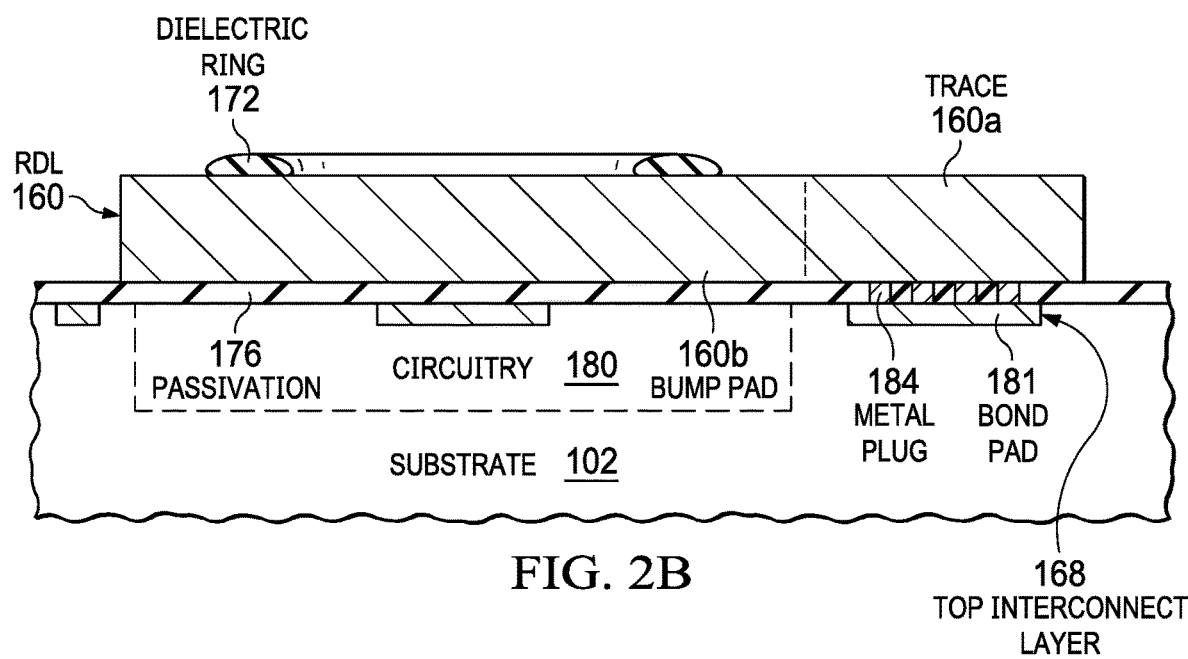

As seen in the cross-sectional view, the RDL 160 is on a passivation layer 176 that has metal filled plugs 184, such as W plugs, that are completely through a thickness of the passivation layer 176 to couple to bond pads shown in FIG. 2A as bond pad 181. FIG. 2B shows results after printing dielectric rings 172 on the bump pads 160*b*, where the opening provided by the dielectric ring 172 is sized for receiving a solder ball shown as solder ball 195 in FIG. 2C.

Figure 2C:
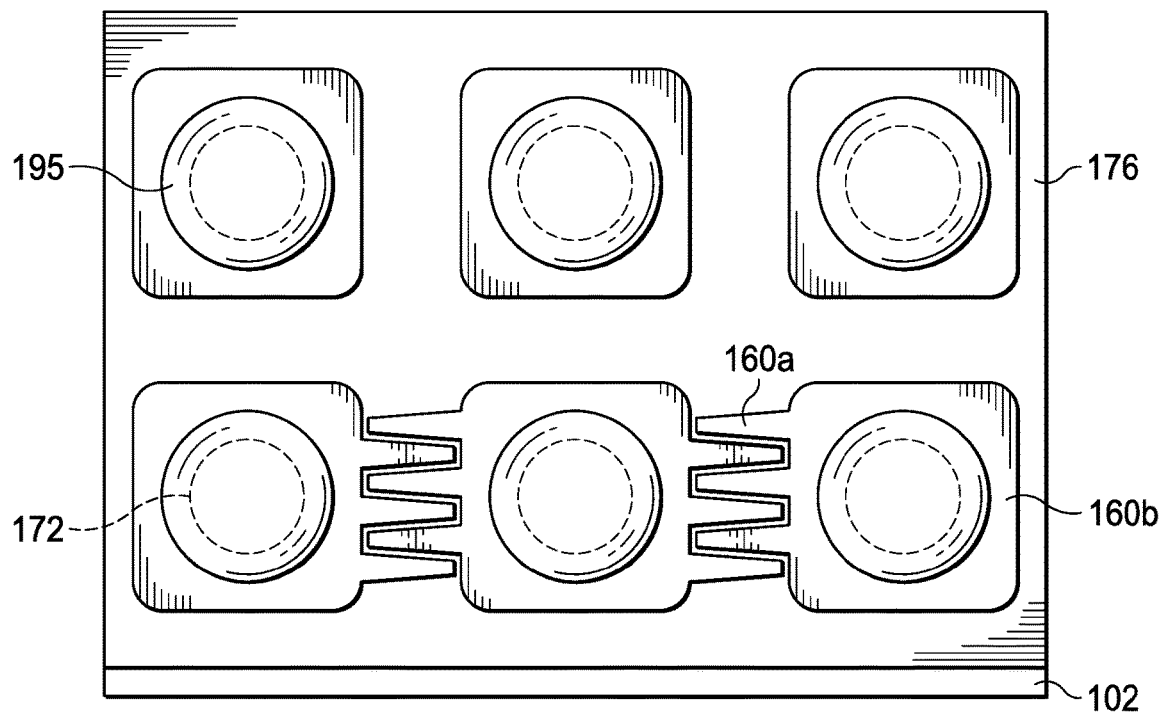
Figure 2C:
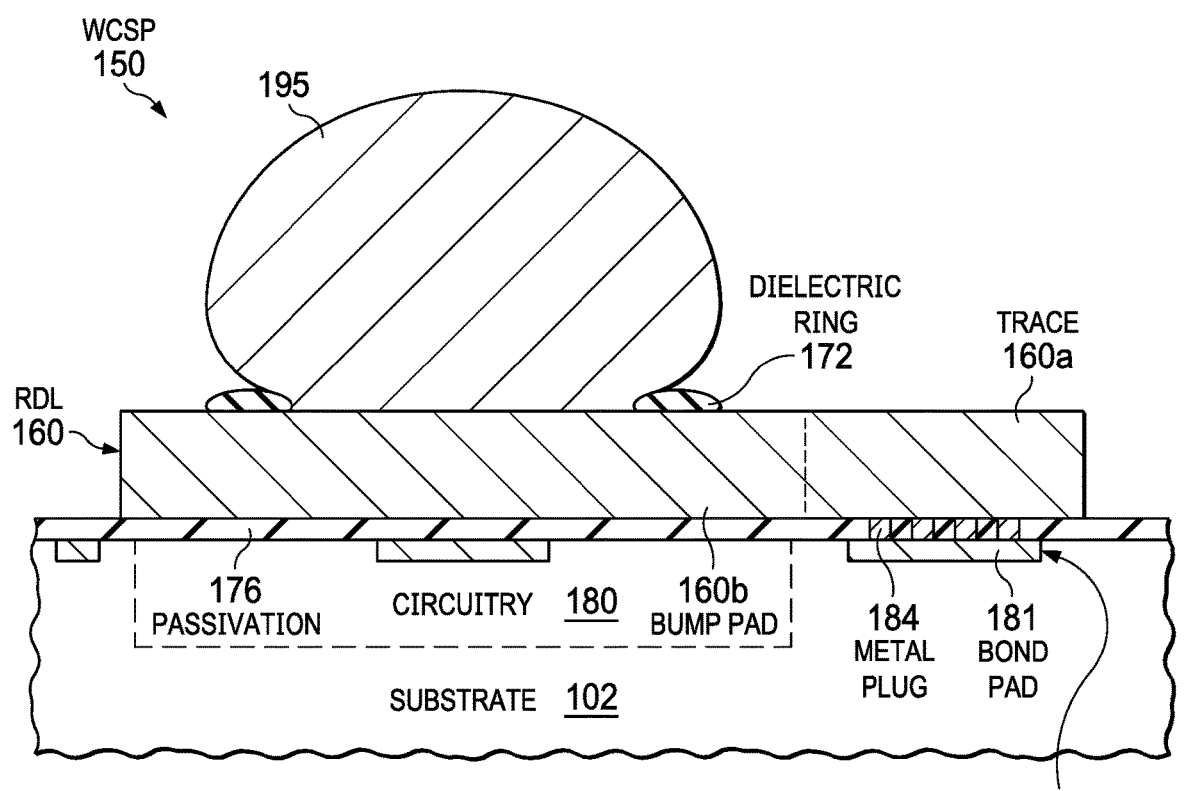
Figure 2D:
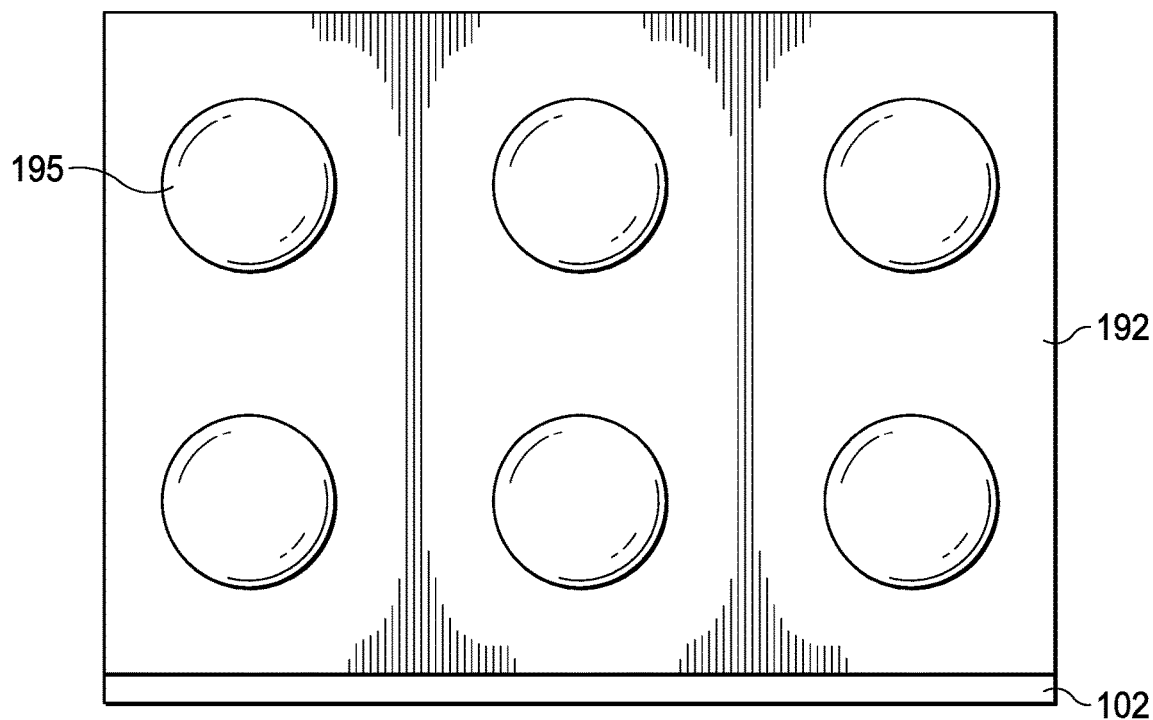
Figure 2D:
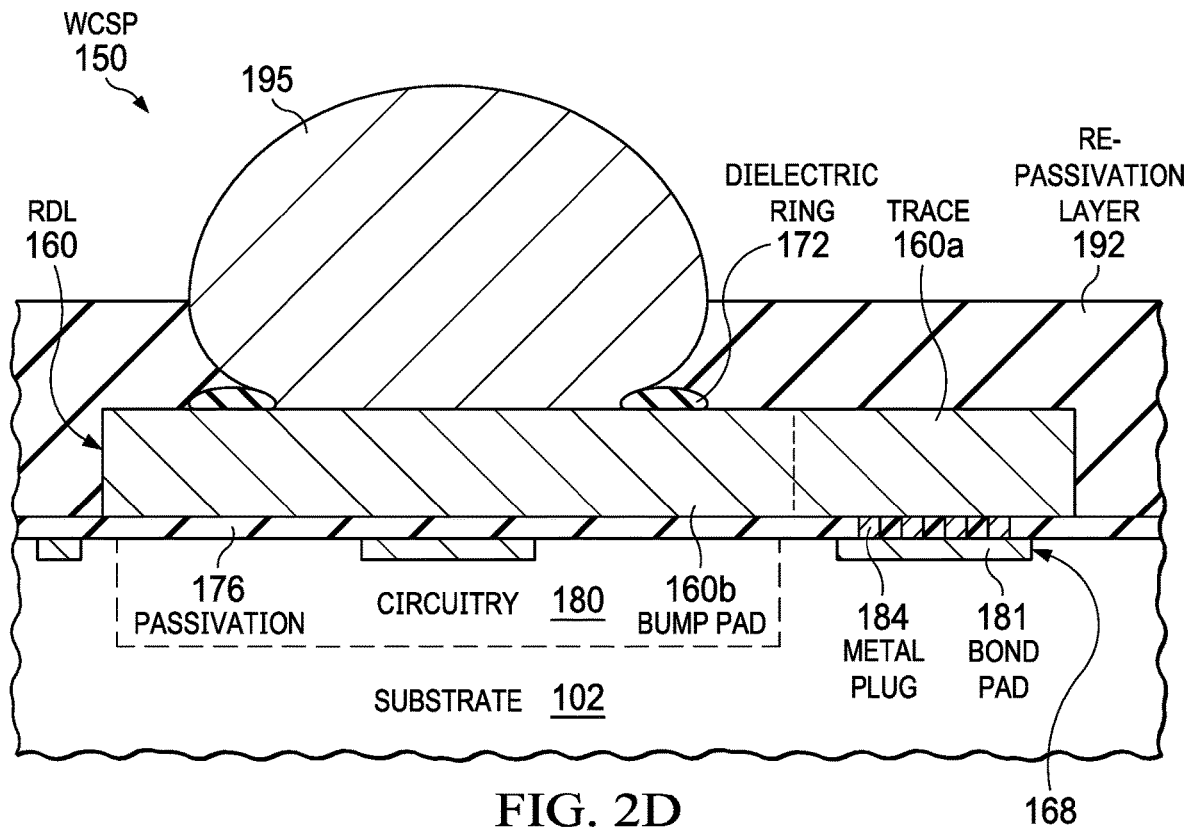

FIG. 2C shows results after attaching (also known as dropping) solder balls 195 onto the bump pads 160*b* so that the solder balls 195 physically contact the dielectric rings 172. FIG. 2D shows results after wafer molding to form a re-passivation layer 192 generally using film assist molding. Subsequent processing can comprise the wafers generally being background, laser-marked singulated, and the singulated die then being placed onto a tape and reel. There is also an option of applying a backside laminate layer after the back-grinding process to reduce die chip-outs induced during sawing, and to ease the handling of the WCSP.

Figure 3:
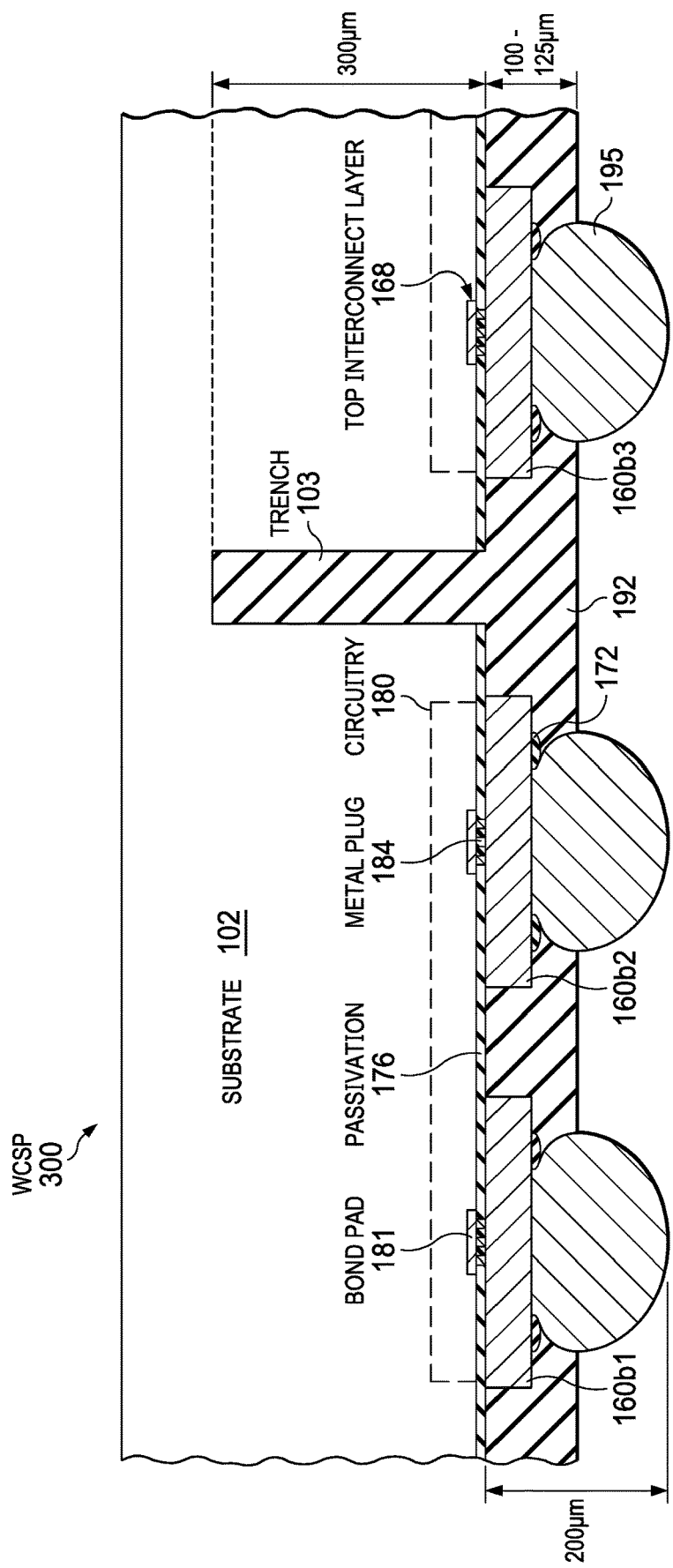
FIG. 3 is a cross-sectional view of a disclosed dielectric ringed solder bump pad with a solder ball on a solder bump pad of a disclosed RDL WCSP having disclosed dielectric ringed solder bump pads including optional substrate trenches for receiving mold compound, also showing some example dimensions.

FIG. 3 is a cross-sectional view of a disclosed dielectric ringed solder bump pad with a solder ball 195 on bump pads 160*b*$_1$, 160*b*$_2$, and 160*b*$_3$ of a disclosed RDL WCSP 300. The dielectric ringed solder bump pads including optional substrate trenches shown as substrate trench 103 for receiving a re-passivation layer 192 generally comprising a mold material. The substrate trench 103 has a depth that is at least 10% of a thickness of the substrate 102, where this thickness is generally less than 50% of the thickness of the substrate 102. RDL WCSP 300 also shows some example dimensions for the substrate trench 103, for the re-passivation layer 192, and for the solder ball 195.

Disclosed aspects can be integrated into a variety of assembly flows to form a variety of different WCSP devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:

1. A wafer chip-scale package (WCSP), comprising:
   a substrate comprising a semiconductor surface layer including circuitry configured for at least one function having at least a top metal interconnect layer thereon that includes at least one bond pad coupled to a node in the circuitry;
   a redistribution layer (RDL) including a bump pad coupled by a trace coupled to metal filled plugs through a passivation layer to the bond pad;
   a solder ball on the bump pad, and
   a dielectric ring on a same surface of the bump pad as the solder ball, the dielectric ring having an inner area in physical contact with the solder ball.

2. The WCSP of claim 1, further comprising a re-passivation layer comprising a mold material including over the dielectric ring and in contact with the solder ball.

3. The WCSP of claim 1, wherein the solder ball is in direct contact with the bump pad.

4. The WCSP of claim 1, wherein the dielectric ring comprises a solder resist material.

5. The WCSP of claim 1, wherein the trace is coupled to the metal filled plugs through the passivation layer to the bump pad.

6. The WCSP of claim 1, wherein the dielectric ring is a fully continuous ring.

7. The WCSP of claim 1, wherein the dielectric ring comprises a plurality of segments that are spaced apart from one another.

8. The apparatus of claim 1, wherein the same surface is a horizontal surface.

9. The apparatus of claim 1, wherein the same surface is a top surface of the bump pad.

10. The apparatus of claim 1, wherein solder resist forms the dielectric ring.

11. The apparatus of claim 1, wherein the dielectric ring is horizontally oriented on the bump pad.

12. The apparatus of claim 1, further including mold material covering at least some portions of the dielectric ring, the substrate, the redistribution layer and the solder ball.

13. A wafer chip-scale package (WCSP), comprising:
    a substrate comprising a semiconductor surface layer including circuitry configured for at least one function having at least a top metal interconnect layer thereon that includes at least one bond pad coupled to a node in the circuitry;
    a redistribution layer (RDL) including a bump pad coupled by a trace coupled to metal filled plugs through a passivation layer to the bond pad;
    a solder ball on the bump pad, and
    a dielectric ring on a same surface of the bump pad as the solder ball, the dielectric ring having an inner area in physical contact with the solder ball, wherein the dielectric ring comprises a polymer base material, and an epoxy-based material.

14. A wafer chip-scale package (WCSP), comprising:
    a substrate comprising a semiconductor surface layer including circuitry configured for at least one function having at least a top metal interconnect layer thereon that includes at least one bond pad coupled to a node in the circuitry;
    a redistribution layer (RDL) including a bump pad coupled by a trace coupled to metal filled plugs through a passivation layer to the bond pad;
    a solder ball on the bump pad;
    a dielectric ring on the bump pad that has an inner area in physical contact with the solder ball; and
    a re-passivation layer comprising a mold material including over the dielectric ring and in contact with the solder ball, wherein the substrate includes at least one trench therein that has a depth that is at least 10% of a thickness of the substrate, and wherein the mold material is also within the trench.

15. An apparatus, comprising:
    circuitry having at least a top metal interconnect layer thereon that includes at least one bond pad coupled to a node in the circuitry;
    a redistribution layer (RDL) including a bump pad coupled by a trace coupled to metal filled plugs through a passivation layer to the bond pad;
    a solder ball on the bump pad, and
    a dielectric ring on a same surface of the bump pad as the solder ball, the dielectric ring having an inner area in physical contact with the solder ball.

16. The apparatus of claim 15, further comprising a re-passivation layer comprising a mold material including over the dielectric ring and in contact with the solder ball.

17. The apparatus of claim 16, wherein the re-passivation material comprises a mold compound.

18. The apparatus of claim 15, wherein the solder ball is in direct contact with the bump pad.

19. The apparatus of claim 15, wherein the dielectric ring comprises a solder resist material.

20. The apparatus of claim 15, wherein the trace is coupled to the metal filled plugs through the passivation layer to the bump pad.

21. The apparatus of claim 15, wherein the dielectric ring is a fully continuous ring.

22. The apparatus of claim 15, wherein the dielectric ring comprises a plurality of segments that are spaced apart from one another.

23. The apparatus of claim 15, wherein the apparatus is a wafer chip-scale package (WCSP).

24. The apparatus of claim 15, wherein the same surface is a horizontal surface.

25. The apparatus of claim 15, wherein the same surface is a top surface of the bump pad.

26. The apparatus of claim 15, wherein solder resist forms the dielectric ring.

27. The apparatus of claim 15, wherein the dielectric ring is horizontally oriented on the bump pad.

28. The apparatus of claim 15, further including mold material covering at least some portions of the dielectric ring, the substrate, the redistribution layer and the solder ball.

29. An apparatus, comprising:
    circuitry having at least a top metal interconnect layer thereon that includes at least one bond pad coupled to a node in the circuitry;
    a redistribution layer (RDL) including a bump pad coupled by a trace coupled to metal filled plugs through a passivation layer to the bond pad;
    a solder ball on the bump pad, and
    a dielectric ring on a same surface of the bump pad as the solder ball, the dielectric ring having an inner area in physical contact with the solder, wherein the dielectric ring comprises a polymer base material, and an epoxy-based material.

30. An apparatus, comprising:
    circuitry having at least a top metal interconnect layer thereon that includes at least one bond pad coupled to a node in the circuitry;

a redistribution layer (RDL) including a bump pad coupled by a trace coupled to metal filled plugs through a passivation layer to the bond pad;
a solder ball on the bump pad;
a dielectric ring on the bump pad that has an inner area in physical contact with the solder ball; and
a re-passivation layer comprising a mold material including over the dielectric ring and in contact with the solder ball, wherein the substrate includes at least one trench therein that has a depth that is at least 10% of a thickness of the substrate, and wherein the mold material is also within the trench.

\* \* \* \* \*